(12) United States Patent
Graham et al.

(10) Patent No.: US 9,574,110 B2
(45) Date of Patent: Feb. 21, 2017

(54) BARRIER CHEMICAL MECHANICAL PLANARIZATION COMPOSITION AND METHOD THEREOF

(71) Applicant: AIR PRODUCTS AND CHEMICALS INC., Allentown, PA (US)

(72) Inventors: Maitland Gary Graham, Phoenix, AZ (US); James Allen Schlueter, Phoenix, AZ (US); Xiaobo Shi, Chandler, AZ (US)

(73) Assignee: AIR PRODUCTS AND CHEMICALS, INC., Allentown, PA (US)

(*) Notice: Subject to any disclaimer, the term of this patent is extended or adjusted under 35 U.S.C. 154(b) by 0 days.

(21) Appl. No.: 14/502,186

(22) Filed: Sep. 30, 2014

(65) Prior Publication Data

US 2015/0104941 A1    Apr. 16, 2015

Related U.S. Application Data

(63) Continuation of application No. 14/051,969, filed on Oct. 11, 2013, now abandoned.

(51) Int. Cl.
| | |
|---|---|
| *C09G 1/02* | (2006.01) |
| *H01L 21/306* | (2006.01) |
| *C09K 3/14* | (2006.01) |
| *H01L 21/321* | (2006.01) |

(52) U.S. Cl.
CPC .............. *C09G 1/02* (2013.01); *C09K 3/1463* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 6,376,381 B1* | 4/2002 | Sabde | 438/693 |
| 6,429,133 B1* | 8/2002 | Chopra | 438/692 |
| 6,443,812 B1* | 9/2002 | Costas et al. | 451/41 |
| 6,773,476 B2 | 8/2004 | Sakai et al. | |
| 7,279,119 B2* | 10/2007 | Hellring et al. | 252/79.1 |
| 2002/0088709 A1* | 7/2002 | Hongo | C25F 3/02 |
| | | | 204/223 |

(Continued)

FOREIGN PATENT DOCUMENTS

| | | |
|---|---|---|
| EP | 2151482 A1 | 2/2010 |
| JP | 2004027165 | 1/2004 |
| WO | 2009107986 A1 | 9/2009 |

*Primary Examiner* — Allan Olsen
(74) *Attorney, Agent, or Firm* — Lina Yang

(57) ABSTRACT

A barrier chemical mechanical planarization polishing composition is provided that includes suitable chemical additives. The suitable chemical additives are organic polymer molecules containing ethylene oxide repeating units having the general molecular structure of

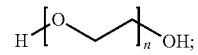

where n refers to the total numbers of the repeating unit giving the molecular weights of polyethylene oxide ranging from 100,000 to 8,000,000. There is also provided a chemical mechanical polishing method using the barrier chemical mechanical planarization polishing composition.

11 Claims, 4 Drawing Sheets

(56) References Cited

U.S. PATENT DOCUMENTS

| | | | |
|---|---|---|---|
| 2002/0102923 A1* | 8/2002 | Sugiyama | C09G 1/02 451/41 |
| 2004/0067649 A1* | 4/2004 | Hellring et al. | 438/689 |
| 2004/0229461 A1* | 11/2004 | Darsillo et al. | 438/689 |
| 2005/0056810 A1* | 3/2005 | Bian et al. | 252/79.1 |
| 2005/0090104 A1* | 4/2005 | Yang et al. | 438/689 |
| 2005/0090109 A1* | 4/2005 | Carter | C09G 1/02 438/692 |
| 2005/0150598 A1 | 7/2005 | Moeggenborg et al. | |
| 2006/0030158 A1* | 2/2006 | Carter | B24B 37/044 438/692 |
| 2006/0046490 A1* | 3/2006 | Banerjee | C09G 1/02 438/692 |
| 2006/0060568 A1* | 3/2006 | So et al. | 216/88 |
| 2006/0075688 A1* | 4/2006 | Takenouchi | C09G 1/02 51/307 |
| 2006/0278123 A1* | 12/2006 | Wirth | 106/1.22 |
| 2007/0082456 A1* | 4/2007 | Uotani et al. | 438/427 |
| 2007/0181534 A1 | 8/2007 | Kamimura | |
| 2007/0200089 A1* | 8/2007 | Inaba | C09G 1/02 252/79.1 |
| 2008/0045020 A1* | 2/2008 | Kim et al. | 438/693 |
| 2008/0081542 A1* | 4/2008 | Hong et al. | 451/37 |
| 2008/0148649 A1 | 6/2008 | Liu | |
| 2009/0004863 A1 | 1/2009 | Kamimura | |
| 2009/0017272 A1* | 1/2009 | Phillips et al. | 428/195.1 |
| 2009/0133716 A1* | 5/2009 | Lee | 134/3 |
| 2009/0246956 A1* | 10/2009 | Takamiya et al. | 438/693 |
| 2010/0151684 A1 | 6/2010 | Choi et al. | |
| 2011/0053462 A1* | 3/2011 | Shida et al. | 451/36 |
| 2011/0059680 A1 | 3/2011 | Motonari et al. | |
| 2011/0117821 A1* | 5/2011 | Nishimoto et al. | 451/36 |
| 2012/0094490 A1* | 4/2012 | Choi et al. | 438/693 |
| 2012/0142191 A1* | 6/2012 | Shi | C09K 13/00 438/693 |
| 2013/0059506 A1* | 3/2013 | Qian et al. | 451/59 |

\* cited by examiner

BARRIER CHEMICAL MECHANICAL PLANARIZATION COMPOSITION AND METHOD THEREOF

CROSS REFERENCE TO RELATED APPLICATIONS

The present patent application is a continuation application of U.S. patent application Ser. No. 14/051,969 which was filed on Oct. 11, 2013.

BACKGROUND OF THE INVENTION

The present invention relates to barrier chemical mechanical planarization ("CMP") polishing compositions (or slurries) used in the production of a semiconductor device, and polishing methods for carrying out chemical mechanical planarization. In particular, it relates to barrier polishing compositions that are suitably used for polishing patterned semiconductor wafers that are composed of multi-type films, such as barrier, Low k or ultra Low k, dielectric, and metal lines, vias or trenches.

Usually, a barrier layer covers the patterned dielectric layer and a metal layer covers the barrier layer. The metal layer has at least sufficient thickness to fill the patterned trenches with metal to form circuit interconnects.

A barrier typically is a metal, metal alloy or intermetallic compound, such as tantalum or tantalum nitride. The barrier forms a layer that prevents migration or diffusion between layers within a wafer. For example, barriers prevent the diffusion of interconnect metal such as copper or silver into an adjacent dielectric. Barrier materials must be resistant to corrosion by most acids, and thereby, resist dissolution in a fluid polishing composition for CMP. Furthermore, these barrier materials may exhibit a toughness that resists removal by abrasion abrasive particles in a CMP slurry and from fixed abrasive pads.

In relation to CMP, the current state of this technology involves the use of a multi-step, such as, a two-step process to achieve local and global planarization.

During step 1 of a CMP process, metal layer such as the overburden copper is removed, while leaving a smooth planar surface on the wafer with metal-filled lines, vias and trenches that provide circuit interconnects planar to the polished surface. First step polishing steps tend to remove excess interconnect metals, such as copper. Then step 2 of the CMP process, frequently referred to as a barrier CMP process, follows to remove the barrier layer and excess metal layers and other films on the surface of the patterned wafers to achieve both local and global planarization surface on the dielectric layer.

US patent application publication, US2007/0082456A provides a polishing composition which allows high-speed polishing while etching and erosion are prevented and the flatness of metal film is maintained. The polishing composition comprises (A) a compound having three or more azole moieties, (B) an oxidizing agent, and (C) one or more species selected from among an amino acid, an organic acid, and an inorganic acid.

US patent application publication, US2007/0181534 teaches a barrier polishing liquid which includes (a) a nonionic surfactant represented by formula below, (b) at least one type of organic acid selected from the group consisting of an aromatic sulfonic acid, an aromatic carboxylic acid, and a derivative thereof, (c) colloidal silica, and (d) benzotriazole or a derivative thereof.

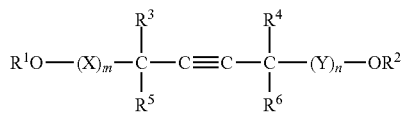

In the formula, $R^1$ to $R^6$ independently denote a hydrogen atom or an alkyl group having 1 to 10 carbons, X and Y independently denote an ethyleneoxy group or a propyleneoxy group, and m and n independently denote an integer of 0 to 20. There is also provided a chemical mechanical polishing method that includes supplying the barrier polishing liquid to a polishing pad on a polishing platen at a rate per unit area of a semiconductor substrate per unit time of 0.035 to 0.25 mL/(min·cm$^2$), and polishing by making the polishing pad and a surface to be polished move relative to each other while they are in a contacted state.

US patent application publication, US2008/0149884 A1 describes a composition and associated method for the chemical mechanical planarization (CMP) of metal substrates on semiconductor wafers. The composition contains a nonionic fluorocarbon surfactant and a per-type oxidizer (e.g., hydrogen peroxide). The composition and associated method are effective in controlling removal rates of low-k films during copper CMP and provide for tuneability in removal rates of low-k films in relation to removal rates of copper, tantalum, and oxide films.

US patent application publication, US 2013/0168348 A1 has found an aqueous polishing composition, the said aqueous polishing composition comprising (A) at least one type of abrasive particles which are positively charged when dispersed in an aqueous medium free from component (B) and having a pH in the range of from 3 to 9 as evidenced by the electrophoretic mobility; (B) at least one water-soluble polymer selected from the group consisting of linear and branched alkylene oxide homopolymers and copolymers; and (C) at least one anionic phosphate dispersing agent; and a process for polishing substrate materials for electrical, mechanical and optical devices making use of the aqueous polishing composition.

US patent application publication, US 2009/0004863 A1 provides a polishing liquid for polishing a ruthenium-containing barrier layer, the polishing liquid being used in chemical mechanical polishing for a semi-conductor device having a ruthenium-containing barrier layer and conductive metal wiring lines on a surface thereof, the polishing liquid comprising an oxidizing agent; and a polishing particulate having hardness of 5 or higher on the Mohs scale and having a composition in which a main component is other than silicon dioxide (SiO$_2$). The present invention also provides a polishing method for chemical mechanical polishing of a semi-conductor device, the method contacting the polishing liquid with the surface of a substrate to be polished, and polishing the surface to be polished such that contacting pressure from a polishing pad to the surface to be polished is from 0.69 kPa to 20.68 kPa.

US 2013/0171824 A1 discloses a CMP process for substrates containing silicon oxide dielectric films and polysilicon and/or silicon nitride films comprising the steps of (1) contacting the substrate with an aqueous composition containing (A) abrasive particles which are positively charged when dispersed in an aqueous medium having a pH in the range of from 3 to 9; (B) a water-soluble or water-dispersible linear or branched alkylene oxide homopolymer or copolymer; and (C) a water-soluble or water-dispersible polymer selected from (c1) aliphatic and cycloaliphatic poly(N- vinylamide) homopolymers and copolymers, (c2) homopolymers and copolymers of acrylamide monomers of the general formulas I and II: $H_2C=C(-R)-C(=0)-N(-R^1)(-R^2)$ (I), $H_2C=C(-R)-C(=0)-R^3$ (II), wherein the variables have the following meaning R hydrogen atom, fluorine atom, chlorine atom, nitrile group, or organic residue; R' and $R^2$ hydrogen atom or organic residue; $R^3$ saturated N-heterocyclic ring; (c3) cationic polymeric flocculants; and (c4) mixtures thereof; (2) polishing the substrate until the silicon oxide dielectric film is removed and the polysilicon and/or silicon nitride film is or are exposed.

Typically, abrasives are used in most barrier CMP compositions (or slurries). The abrasives with variable particle size and shapes provide mechanical friction forces between polishing pad and wafer surface under applied pressure. When abrasives are used, especially with high concentration, abrasive damage (scratching) can occur.

Barrier slurry compositions need to meet several stringent requirements including high barrier removal rates, very low post-polish topography, no corrosion defects and very low scratches or residue defects. Therefore, there are significant needs for barrier CMP compositions, CMP process(es) or methods when these requirements become more and more stringent as the semiconductor industry continues to move towards smaller and smaller feature sizes.

BRIEF SUMMARY OF THE INVENTION

Described herein are barrier CMP polishing compositions and methods for the CMP processing.

In one embodiment, described herein is a barrier chemical mechanical planarization polishing composition comprising:
  abrasive;
  organic polymer containing ethylene oxide repeating units having the general molecular structure of

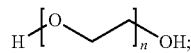

wherein n refers to the total numbers of the repeating unit giving molecular weights ranging from 100,000 to 8,000,000;
  oxidizing agent;
  corrosion inhibitor; and
  chelator.

In a further embodiment, described herein is a polishing method for chemical mechanical planarization a surface of a semiconductor substrate having at least one feature thereon comprising conductive metal lines, vias or trenches, a metal-containing barrier layer and a dielectric layer; comprising the steps of:
  a) contacting the at least one surface with a polishing pad;
  b) delivering a polishing composition to the at least one surface, the polishing composition comprising:
    abrasive;
    organic polymer containing ethylene oxide repeating units having the general molecular structure of

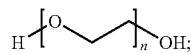

wherein n refers to the total numbers of the repeating unit giving molecular weights ranging from 100,000 to 8,000,000;
    oxidizing agent;
    corrosion inhibitor; and
    chelator;
  and
  C) polishing the substrate with the polishing composition.

The organic polymer containing ethylene oxide repeating units has molecular weights ranging preferably from 300,000 to 4,000,000; and most preferably from 400,000 to 1,000,000; and has concentration ranging from 5 ppm to 5,000 ppm; preferably from 25 ppm to 2,000 ppm; and most preferred concentration range is from about 50 ppm to about 1,000 ppm.

The abrasive is preferably selected from the group consisting of colloidal silica, alumina, ceria, germania, silica, titania, zirconia, alumina doped colloidal silica in lattices, organic polymer particles, composite particles of inorganic and organic particles, surface modified inorganic/organic particles, and combinations thereof; and is preferably present in an amount ranging from about 0.1% to about 15 wt %; preferably from about 1 wt % to about 3 wt %;

The oxidizing agent is preferably selected from the group consisting of hydrogen peroxide, periodic acid, potassium iodate, potassium permanganate, ammonium persulfate, ammonium molybdate, ferric nitrate, nitric acid, potassium nitrate, ammonia, amine compounds, and combinations thereof; and is preferably present in an amount ranging from about 0.05 wt % to about 10 wt %; preferably from about 0.5 wt % to about 2 wt %.

The corrosion inhibitor is preferably selected from the group consisting of benzotriazole or benzotriazole derivatives, 3-amino-1,2,4-triazole, 3,5-diamine-1,2,4-triazole, and combinations thereof; and is preferably present in an amount ranging from about 0.001 wt % to about 1.0 wt %; preferably from about 0.01 wt % to about 0.1 wt %;

The chelator is preferably selected from the group consisting of benzosulfonic acid, 4-tolyl sulfonic acid, 2,4-diamino-benzosulfonic acid, and malonic acid, and also non-aromatic organic acids, such as itaconic acid, malic acid, tartaric acid, citric acid, oxalic acid, gluconic acid, lactic acid, mandelic acid, and combinations thereof; and is preferably present in an amount ranging from about 0.01 wt % to about 3.0 wt %; preferably about from 0.4 wt % to about 1.5 wt %.

The polishing composition further comprises a pH adjuster selected from the group consisting of (a) nitric acid, sulfuric acid, tartaric acid, succinic acid, citric acid, malic acid, malonic acid, various fatty acids, various polycarboxylic acids and combinations thereof to lower pH of the polishing composition; and (b) potassium hydroxide, sodium hydroxide, ammonia, tetraethylammonium hydroxide, ethylenediamine, piperazine, polyethyleneimine, modified polyethyleneimine, and combinations thereof to raise pH of the polishing composition. The pH adjuster is preferably present in an amount ranging from about 0.0001 wt % to about 2 wt %; and the polishing composition has a pH from about 2 to about 12, preferably about 9 to about 11.5.

The remainder of the polishing composition is preferably water, more preferably deionized water.

The conductive metal can be copper. The metal-containing barrier layer can be a tantalum-containing barrier layer, such as tantalum or tantalum nitride or tantalum tungsten silicon carbide; a titanium containing barrier layer, such as titanium or titanium nitride; a cobalt or self-forming manganese oxide layer; noble metals such as ruthenium; The dielectric layer can be TEOS; a porous or a non-porous low-K film comprising of silicon, carbon, oxygen and hydrogen; a porous low K material with a capping layer of a non-porous material.

DETAILED DESCRIPTION OF THE INVENTION

Figure 1:
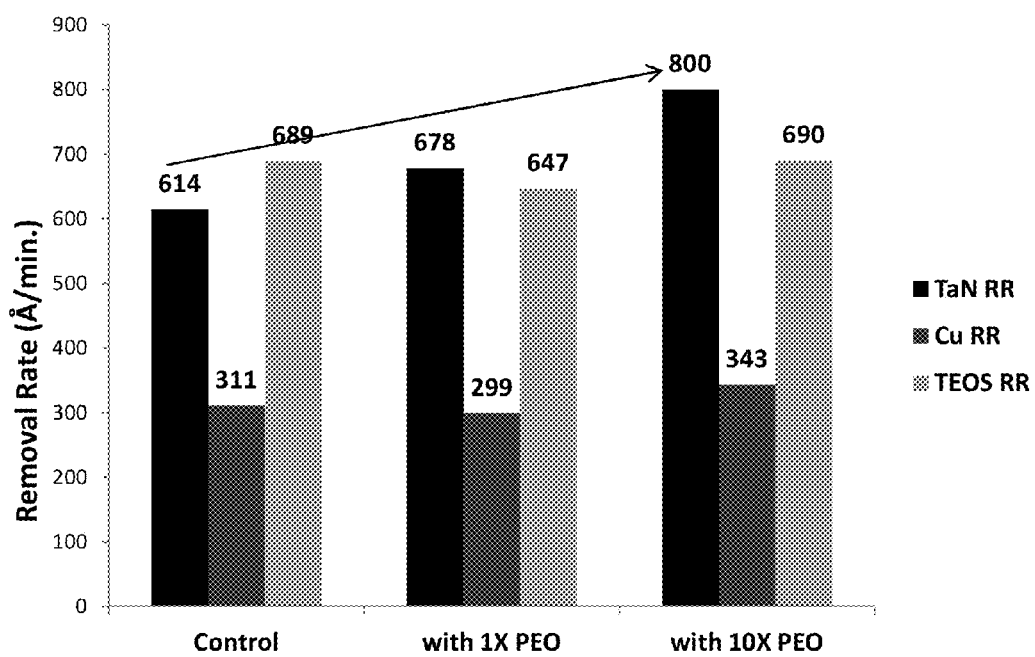
FIG. 1 shows the removal rates of TaN, Cu and TEOS when PEO was used as the chemical additive

Generally, after removal of overburden copper in step 1, polished wafer surfaces have non-uniform local and global planarity due to differences in the step heights at various locations of the wafer surfaces. Low density features tend to have higher copper step heights whereas high density features tend to have low step heights. Due to differences in the step heights after step 1, step 2 CMP slurries selective barrier layer relative to copper removal rates and copper to oxide removal rates are highly desirable. The ratio of the removal rate of tantalum to the removal rate of copper is called the "selectivity" for removal of tantalum in relation to copper during CMP processing of substrates comprised of copper, tantalum and dielectric material.

The barrier chemical mechanical polishing composition is effective for use in the second stage of chemical mechanical polishing of the patterned wafers and provides at least one of the following: affords a desirable removal rates of various types of film, affords a desirable low level of within a wafer non-uniformity ("W|W NU %"), results in low residue level(s) being present on the polished wafer(s) subsequent to CMP processing, and affords desirable selectivity among various films.

A specific featured distortion that is unsuitable for semiconductor manufacturing is the damages to copper vias or metal lines caused by the further corrosion of chemical components interacting with copper vias or metal lines in a chemical mechanical polishing process. Therefore, it is very important to use corrosion inhibitor in barrier CMP slurry to reduce and control further corrosion of copper vias or trenches during chemical mechanical polishing processes, and also reduce the defects.

In step 2 CMP processes, the chemical reactions involved in using barrier CMP composition include: oxidation reactions induced by the oxidant used in the barrier CMP slurry, for example, $H_2O_2$. The surfaces of metal, such as copper, lines, vias or trenches, and barrier material, such as Ta, are oxidized into the relative metal oxide films. Typically, metal copper is oxidized into a mixture of cuprous and cupric oxides, and Ta is oxidized to $Ta_2O_5$ (the preferred oxide form for Ta). Chelators, ligands or other suitable chemical additives which can be chemically bonded to the copper cations and tantalum cations are used in barrier CMP slurry to accelerate the dissolution of copper oxide and tantalum oxide to yield the desirable removal rates of copper lines, vias, or trenches and barrier layer, or barrier films.

Described and disclosed herein are the barrier CMP slurry formulations, and methods for polishing. It is believed that these formulations can boost the barrier film removal rates, lower the abrasive concentration, and reduce defects during CMP processing. The barrier CMP slurry formulations are used for chemical mechanical planarization a surface of a semiconductor substrate having at least one feature thereon comprising conductive metal lines, vias or trenches, a metal-containing barrier layer and a dielectric layer. The conductive metal can be copper. The metal-containing barrier layer can be a tantalum-containing barrier layer, such as tantalum or tantalum nitride or tantalum tungsten silicon carbide; a titanium containing barrier layer, such as titanium or titanium nitride; a cobalt or self-forming manganese oxide layer; noble metals such as ruthenium; The dielectric layer can be TEOS; a porous or a non-porous low-K film comprising of silicon, carbon, oxygen and hydrogen; a porous low K material with a capping layer of a non-porous material.

The barrier CMP slurry formulations contain the high purity colloidal silica particles as abrasives; the corrosion inhibitor to provide corrosion inhibition on metal lines, vias, or treches; a suitable chemical additive to enhance the removal rate of barrier layer/film; a surface wetting agent or surfactant that wets surface and reduce surface tensions on wafer surfaces, and a pH adjusting agent that is used to adjust pH of the barrier polishing composition to the optimized pH condition. Also, hydrogen peroxide are selected and used as oxidizing agent for the disclosed barrier CMP polishing compositions.

Optionally, an aromatic organic acid may be used in the disclosed barrier polishing composition herein to tune some film removal rates. The aromatic organic acid can be described as a ligand that can have some interactions with some films on the surfaces of the wafers.

The suitable chemical additives are organic polymer molecules containing ethylene oxide repeating units, such as polyethylene oxide (PEO), having the general molecular structure of

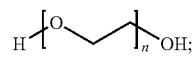

wherein n refers to the total numbers of the repeating giving the molecular weights ranging from 100,000 to 8,000,000. A preferred range is from 300,000 to 4,000,000; and the most preferred concentration range is from 400,000 to 1,000,000. The term "molecular weight" includes viscosity average molecular weight. An example of a suitable PEO is Sigma-Aldrich Product No. 372773 (MV CA. 400,000), CAS Number 25322-68-3. The amount of polyethylene oxide ranges from 5 ppm to 5,000 ppm, relative to the total weight of the barrier CMP composition. A preferred range is from 25 ppm to 2,000 ppm, and the most preferred concentration range is from about 50 ppm to about 1,000 ppm.

The ethylene oxide repeating units of polyethylene oxide (PEO) are able to form coordination bonds with oxidized metal cations in barrier film. Those more soft complexes in barrier films lead to the enhanced barrier film removal rates.

The suitable abrasives for this invention include, but are not limited to, high purity colloidal silica, alumina, ceria, germania, silica, titania, zirconia, alumina dopes colloidal silica in lattices, and mixtures thereof. For example, high purity colloidal silica is preferably used as abrasives in the disclosed barrier CMP slurry. The high purity colloidal silica can be made from sodium silicate, or can be made from TEOS or TMOS. (How to see the low ranges)

The amount of abrasive ranges from about 0.1% to about 15% relative to the total weight of the barrier CMP composition. The preferred range is from about 1% to about 5%.

A surfactant is used in the barrier CMP slurry as surface wetting agent; suitable surfactant compounds that may be added to the barrier CMP slurry as surface wetting agent include, any of the numerous nonionic, anionic, cationic or amphoteric surfactants known to those skilled in the arts. One example of nonionic surfactant is tricosaethylene glycol dodecyl ether.

The amount of surfactant ranges from about 0.0001% to about 1.0 wt % relative to the total weight of the barrier CMP composition. The preferred range is from about 0.010% to about 0.1%.

Chelators, or chelating ligands are used in the barrier CMP slurry to enhance affinity of chelating ligands for metal cations. Suitable chelators, or chelating ligands include, but are not limited to, for example, benzenesulfonic acid, 4-tolyl sulfonic acid, 2,4-diamino-benzosulfonic acid, and etc., and also non-aromatic organic acids, such as itaconic acid, malic acid, malonic acid, tartaric acid, citric acid, oxalic acid, gluconic acid, lactic acid, mandelic acid, and combinations thereof. The amount of chelators, or chelating ligands ranges from about 0.01 wt % to about 3.0 wt % relative to the total weight of the barrier CMP composition; preferably from about 0.4 wt % to about 1.5 wt %.

A pH-adjusting agent is used in the barrier CMP slurry to raise or lower the pH of the polishing composition. The pH-adjusting agent may be used to improve the stability of the polishing composition, to tune the ionic strength of the polishing composition, and to improve the safety in handling and use. Suitable pH-adjusting agents to lower the pH of the polishing composition include, but are not limited to, nitric acid, sulfuric acid, tartaric acid, succinic acid, citric acid, malic acid, malonic acid, various fatty acids, various polycarboxylic acids and mixtures thereof. Suitable pH-adjusting agents to raise the pH of the polishing composition include, but are not limited to, potassium hydroxide, sodium hydroxide, ammonia, tetraethylammonium hydroxide, ethylenediamine, piperazine, polyethyleneimine, modified polyethyleneimine, and mixtures thereof.

The amount of pH-adjusting agent ranges from about 0.0001 wt % to about 5 wt % relative to the total weight of the barrier CMP composition. The preferred range is about 0.01 wt % to about 1 wt %.

The pH of the barrier CMP composition ranges from about 2 to about 12. The preferred range is about 9 to about 11.5.

The barrier polishing composition further comprises a corrosion inhibitor. Suitable corrosion inhibitors include, but are not limited to: benzotriazole (BTA) or BTA derivatives, 3-amino-1,2,4-triazole, 3,5-diamine-1,2,4-triazole, other triazole derivatives, and combinations thereof.

The amount of corrosion inhibitor ranges from about 0.001 wt % to about 1.0 wt % relative to the total weight of the barrier CMP composition. The preferred range is from about 0.01 wt % to about 0.1 wt %;

The polishing composition includes an oxidizing agent, or oxidizer. The oxidizing agent can be any suitable oxidizing agent. Suitable oxidizing agents include, but are not limited to, one or more peroxy-compounds, which comprise at least one peroxy group (—O—O—). Suitable peroxy-compounds include, for example, peroxides, persulfates (e.g., monopersulfates and dipersulfates), percarbonates, and acids thereof, and salts thereof, and mixtures thereof. Other suitable oxidizing agents include, for example, oxidized halides (e.g., iodates, periodates, and acids thereof, and mixtures thereof, and the like), perboric acid, perborates, percarbonates, peroxyacids (e.g., peracetic acid, perbenzoic acid, salts thereof, mixtures thereof, and the like), permanganates, cerium compounds, ferricyanides (e.g., potassium ferricyanide), mixtures thereof, and the like.

Some specific oxidizing agents include, but are not limited to, hydrogen peroxide, periodic acid, potassium iodate, potassium permanganate, ammonium persulfate, ammonium molybdate, ferric nitrate, nitric acid, potassium nitrate, ammonia, and mixtures thereof. Preferred oxidizing agents include, for example, hydrogen peroxide and urea-hydrogen peroxide.

The amount of oxidizing agent ranges from about 0.05% to about 10% relative to the total weight of the barrier CMP composition. The preferred range is about 0.5% to about 2%.

The polishing composition may optionally include aromatic organic acids. Suitable aromatic organic acids include, but are not limited to, for example, benzosulfonic acid and 4-tolyl sulfonic acid, 2,4-diamino-benzosulfonic acid, and etc., and also non-aromatic organic acids, such as itaconic acid, malic acid, malonic acid, tartaric acid, citric acid, oxalic acid, gluconic acid, lactic acid, mandelic acid, and combinations thereof.

The amount of aromatic organic acids ranges from about 0.1 to about 3.0 wt relative to the total weight of the barrier CMP composition. The preferred range is about 0.25% to about 1.5%.

In some embodiments, the described barrier polishing compositions for barrier CMP processing, comprise a corrosion inhibitor such as BTA or BTA derivatives, triazole or triazole derivatives; more specifically, such as 3-amino-1,2, 4-triazole, 3,5-diamino-1,2,4-triazle or others; a or chelating ligand such as benzenesulfonic acid; a surface wetting agent such as tricosaethylene glycol dodecyl ether; an organic polymer such as polyethylene oxide polymer as chemical additive; an abrasive; a pH-adjusting agent and an oxidizing agent. Such compositions have been successfully used in the present invention as barrier CMP polishing slurries for the advanced node applications, and provided the desirable removal rates in polishing multi-type films and the desirable selectivity.

The polishing compositions and methods described herein will be illustrated in more detail with reference to the following examples, but it should be understood that it is not deemed to be limited thereto.

Working Examples

Polishing Pad Polishing pad, Fujibo H7000HN, was used during CMP, supplied by Narubeni America Corporation.

PETEOS Plasma enhanced deposition of tetraethoxy silane, dielectric oxide layer.

TEOS Tetraethyl orthosilicate

Parameters:

Å: angstrom(s)—a unit of length

BP: back pressure, in psi units

CMP: chemical mechanical planarization=chemical mechanical polishing

CS: carrier speed

DF: Down force: pressure applied during CMP, units psi min: minute(s)

ml: milliliter(s)

mV: millivolt(s)

psi: pounds per square inch

PS: platen rotational speed of polishing tool, in rpm (revolution(s) per minute)

SF: polishing composition flow, ml/min

Removal Rates and Selectivity

Cu RR 2.0 psi Measured copper removal rate at 2.0 psi down pressure of the CMP tool TaN RR 2.0 psi Measured tantalum removal rate at 2.0 psi down pressure of the CMP tool TEOS RR 2.0 psi Measured TEOS removal rate at 2.0 psi down pressure of the CMP tool BD1 RR 2.0 psi Measured BD1 removal rate at 2.0 psi down pressure of the CMP tool Selectivity of Cu/BD/TaN/TEOS=Cu RR/BD RR/TaN RR/TEOS RR at same down force (psi)

General Experimental Procedure

All percentages are weight percentages unless otherwise indicated. In the examples presented below, CMP experiments were run using the procedures and experimental conditions given below.

The CMP tool that was used in the examples is a Mirra®, manufactured by Applied Materials, 3050 Boweres Avenue, Santa Clara, Calif., 95054. A Fujibo H7000HN pad, supplied by Narubeni America Corporation, was used on the platen for the blanket wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by Air Products Chemical Incorporation, at baseline conditions. Polishing experiments were conducted using electroplating deposited copper, low-k dielectric layer materials (Black Diamond), TEOS and tantalum nitride wafers. These blanket wafers were purchased from Silicon Valley Microelectronics, 1150 Campbell Ave, Calif., 95126, and Advantiv Corporation.

The film thickness specifications are summarized below:

Copper: 10,000 Å electroplated copper/1,000 Å copper seed/250 Å Ta on silicon

Tantalum Nitride: 3000 Å/5,000 Å on silicon

BD: BD1 10,000 Å

TEOS: 15,000 Å

Example 1

A reference or control barrier CMP polishing composition contained about 3 wt % high purity colloidal silica, 1.0 wt % hydrogen peroxide, about 0.01 wt % BTA as corrosion inhibitor, about 0.0075 wt % of a surface wetting agent (tricosaethylene glycol dodecyl ether), and a chelator or chelating ligand (benzosulfonic acid, 0.4447 wt %). The remainder was deionized water. The pH of the composition was about 11.0 before adding hydrogen peroxide and 10.5 after the addition of hydrogen peroxide.

Polyethylene oxide (PEO) polymer as the chemical additive was added to the reference polishing composition. The CMP barrier slurry with 1×PEO had a concentration of 100 ppm; and molecular weight of 1000,000. The CMP barrier slurry with 10×PEO contained 10 times as much of PEO as in 1×PEO barrier slurry. All three barrier CMP polishing compositions had same type and concentration of colloidal silica particles as abrasives.

The results of removal rate from three barrier CMP polishing compositions: the reference polishing composition, the 1×PEO and 10×PEO polishing compositions were shown in Table 1.

Table 1 presented the removal rates of TaN, Cu and TEOS from all three barrier CMP polishing compositions. The reference barrier polishing composition gave TaN film removal rate at 614 A/min., for the barrier polishing compositions that contain 1×, and 10× concentration PEO polymer as the chemical additive, the removal rates of TaN film were increased by about 10.4%, and about 30.3% respectively. TaN film removal rates were boosted by using polyethylene oxide polymer as the chemical additive.

The effects of polyethylene oxide as the chemical additive in barrier CMP polishing compositions on the removal rates of TaN, Cu, and TEOS were also depicted in FIG. 1. As the results shown in FIG. 1, the removal rates of copper films and TEOS were not greatly affected by adding polyethylene oxide polymer as the chemical additive. The largest effects of polyethylene oxide polymer as the chemical additive in barrier polishing composition were on TaN barrier film removal rate changes.

TABLE 1

Effects of PEO additives in Barrier Slurries on The Removal Rates of TaN and Cu Films and TEOS

| Formulations (3 wt % Silica) | TaN Removal Rate (A/min.) | TaN Removal Rate % Change | Cu Removal Rate (A/min.) | TEOS Removal Rate (A/min.) |
|---|---|---|---|---|
| Control barrier slurry, no PEO | 614 | — | 311 | 689 |
| Barrier slurry with 1X PEO | 678 | +10.4% | 299 | 647 |
| Barrier slurry with 10X PEO | 800 | +30.3% | 344 | 690 |

The removal rates of copper film and TEOS were not greatly affected by adding PEO polymer as the chemical additive. Since the removal rate of TaN film was boosted, thus, adding PEO polymer as the chemical additive could afford desirable selectivity among various films.

The effects of polyethylene oxide polymer as the chemical additive in barrier CMP polishing compositions on defect counts were also observed. The results were listed in Table 2.

TABLE 2

Effects of PEO additives in Barrier Slurries on Defect Counts on Cu Wafers

| Formulations (3 wt % Silica) | Defect Count on Cu (0.125 micron) | Defect % Change (0.125 micron) | Defect Count on Cu (0.20 micron) |
|---|---|---|---|
| Control slurry without PEO | 205 | — | 84 |
| Slurry with 1X PEO | 94 | −54.1% | 72 |
| Slurry with 10XPEO | 149 | −27.3% | 73 |

As the results shown in Table 2, the defect counts on copper wafer surface were reduced by using polyethylene oxide polymer as the chemical additive in the disclosed barrier polishing compositions at both defect inspection resolutions. With the defect inspection resolution setting at 0.125 micron, the defect count was reduced by about 54.1% for 1× concentrated PEO as the chemical additive, and by about 27.3% for 10× concentrated PEO as the chemical additive. With the defect inspection resolution setting at 0.20 micron, the defect counts were reduced by about 13% to about 14% respectively for 1×, and 10× concentrated PEO used as the chemical additives in the barrier CMP polishing compositions.

Figure 2:
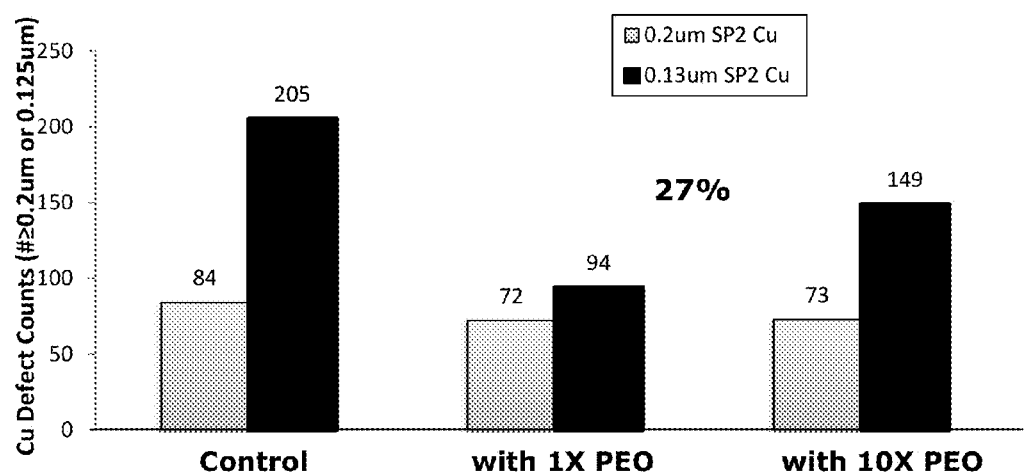
FIG. 2 shows the defect counts on Cu substrates when PEO was used as the chemical additive

The effects of polyethylene oxide as the chemical additive in barrier CMP polishing compositions on the defect counts on Cu substrate surface were also depicted in FIG. 2. As the results shown in FIG. 2, using polyethylene oxide polymer as the chemical additive in the disclosed herein barrier CMP polishing compositions indeed led to the reduction of defect counts on Cu substrate surface after barrier CMP process.

Example 2

The polishing tests in Example 1 had shown that the removal rate of TaN film was boosted by adding polyethylene oxide polymer as the chemical additive at 1×, and 10× concentrations. To further reduce the defects, believed to be mainly from the abrasive, barrier polishing compositions could contain lower concentrations of the abrasives but still provide the same range of removal rate for the TaN film. In this Example, the tests were carried out using the barrier CMP polishing compositions containing 2 wt % abrasive (high purity colloidal silica) and polyethylene oxide polymer as the chemical additive at 1×, and 10× concentrations, respectively. 2 wt % and 3 wt % abrasive concentrations were used as the reference barrier CMP polishing compositions. The colloidal silica particles used in all tested barrier CMP polishing compositions possessed the same shape, size, and particle size distributions.

As the results shown in Table 3, for the barrier polishing composition having 1× concentration of polyethylene oxide polymer as the chemical additive and 2 wt % colloidal silica abrasive, the removal rate of TaN film was 513 A/min., which was about 8% higher than the removal rate from the 2 wt % colloidal silica abrasive reference, but about 23% lower than the removal rate obtained from the reference barrier slurry with 3 wt % colloidal silica abrasive. For the barrier polishing composition with 10× concentration of polyethylene oxide polymer as the chemical additive and 2 wt % colloidal silica abrasive, the removal rates of TaN film was 650 A/min, which was about 36% higher than the removal rate from the 2 wt % colloidal silica abrasive reference, and was almost the same as the TaN removal rate obtained for the reference barrier slurry with 3 wt % colloidal silica concentration (at 666 A/min).

TABLE 3

Effects of PEO as the chemical additive on the Removal Rates of TaN, Cu and TEOS with Low Abrasive Concentration

| Formulations | TaN Removal Rate (A/min.) | Cu Removal Rate (A/min.) | TEOS Removal Rate (A/min.) |
|---|---|---|---|
| Control barrier slurry 2 wt % silica and no PEO | 477 | 444 | 450 |
| Barrier slurry with 2 wt % silica and 1X PEO | 513 | 215 | 407 |
| Barrier slurry with 2 wt % Silica and 10X PEO | 650 | 247 | 468 |
| Control barrier slurry 3 wt % silica and no PEO | 666 | 316 | 687 |

The reduced removal rates (compared to both references) of copper film and TEOS from the polishing compositions having 1× and 10× concentration of polyethylene oxide polymer could expand the desirable selectivity among various films.

The effects of polyethylene oxide polymer as the chemical additive in barrier CMP polishing compositions on defect counts were also observed. The results were listed in Table 4.

As the results shown in Table 4, with 1× concentration polyethylene oxide as the chemical additive and 2 wt % colloidal silica as the abrasive, the defect count was reduced from 315 for the referenced standard barrier slurry with 3 wt % colloidal silica to 114 representing about 63.8% reduction in defect count on copper substrate. With 10× concentration polyethylene oxide as the chemical additive and 2 wt % colloidal silica as the abrasive, the defect count on copper substrate was reduced from 314 for the referenced standard barrier slurry with 3 wt % colloidal silica to 151, representing 52.1% reduction in defect count on copper substrate.

When compared with the reference barrier slurry formulation with 2 wt colloidal silica as abrasives, with the addition of 1× concentration of PEO as chemical additive, the defect on Cu wafer was reduced by about 26%, and almost no change was observed when 10× concentrated PEO used as the chemical additive.

TABLE 4

Effects of PEO as the chemical additive and Lower Abrasive Concentration in Barrier Slurries on the Defect Counts on Cu and TEOS Substrates

| Formulations | Defect Count on Cu (0.125 micron) | Defect % Change (3 wt %; 2 wt % silica) | Defect Count on TEOS (0.13 micron) |
|---|---|---|---|
| Control barrier slurry no PEO and 3 wt % silica | 315 | — | 114 |
| Control barrier slurry no PEO and 2 wt % silica | 154 | — | 209 |
| Barrier slurry with 1X PEO and 2 wt % silica | 114 | −63.8%; −26% | 24 |
| Barrier slurry with 10X PEO and 2 wt % Silica | 151 | −52.1%; same | 61 |

Also showed in Table 4, the defect counts on TEOS wafers were greatly reduced with the use of PEO as chemical additives for barrier slurry formulations. The defects on TEOS were reduced from 209 for the reference formulation with 2 wt colloidal silica to 24 with 1×PEO and 61 with 10×PEO as the chemical additive in the formulations. These defect reductions on TEOS wafers were 89% for 1×PEO and 71% for 10×PEO as the chemical additive in the polishing compositions.

Figure 3:
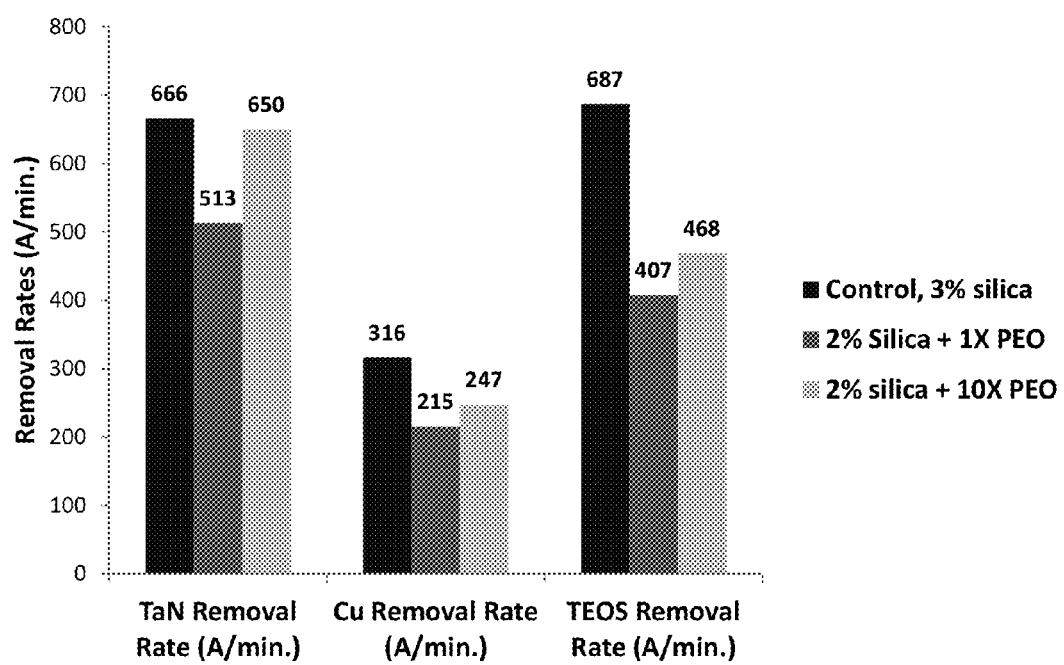
FIG. 3 shows the removal rates of TaN, Cu and TEOS when PEO was used as the chemical additive and low concentration silica was used as the abrasive.
Figure 4:
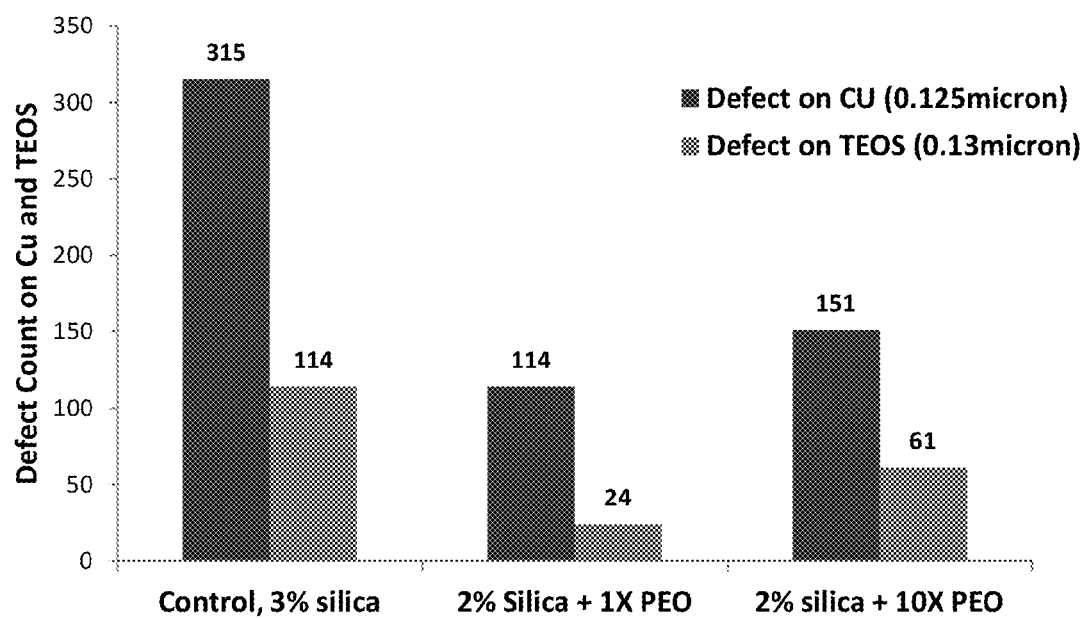
FIG. 4 shows the defect counts on Cu substrates when PEO was used as the chemical additive and low concentration silica was used as the abrasive.

The effects of polyethylene oxide as the chemical additive in the barrier polishing compositions with lower colloidal silica abrasive concentration on the polishing removal rates and defect counts were also depicted in FIG. 3 and FIG. 4 respectively.

This Example had indicated that using the combined effects of adding polyethylene oxide polymer as the chemical additive to boost TaN film removal rates and to reduce defects, the barrier polishing compositions having the lower abrasive concentration compared to the standard reference barrier polishing composition still provided comparable removal rates for TaN film while further reducing the defect counts on copper and TEOS substrate surfaces.

Example 3

The polishing removal rates and defect counts were measured using different polymer molecular weights of polyethylene oxide polymer as the chemical additive in barrier CMP polishing compositions. Polyethylene oxide polymers with molecular weights of 100,000; 300,000; 400,000; 600,000; and 1,000,000 were tested. The wt % range of PEO is from 100 ppm to 1,000 ppm.

Two different molecular weight distributions of polyethylene oxide polymer with same concentration at about 0.01 wt % to about 0.1 wt % were used in the barrier CMP polishing compositions having (2 wt % or 3 wt %) colloidal silica abrasive to compare the polishing performances. The results were listed in Table 5.

As the results shown in Table 5, when polyethylene oxide having molecular weight of 600,000 was used, TaN removal rate was increased from 577 A/min. to 703 A/min., representing about 21.8% increase on TaN removal rate. When polyethylene oxide having molecular weight of 1,000,000 was used, TaN removal rate was increased from 577 A/min. to 737 A/min., representing about 27.7% increase on TaN removal rate. Therefore, polyethylene oxide as the chemical additive in barrier CMP polishing composition boosted barrier film removal rates.

TABLE 5

Effects of PEO with different MW on the removal rates

| Formulations (2 wt % silica) | TaN RR (A/min.) | Cu RR (A/min.) | TEOS RR (A/min.) | BD1 RR (A/min.) |
|---|---|---|---|---|
| Control barrier slurry no PEO | 577 | 309 | 691 | 924 |
| Barrier slurry with PEO MW 600,000 | 703 | 473 | 558 | 439 |
| Barrier slurry with PEO MW 1,000,000 | 737 | 467 | 532 | 379 |

It is also worth pointing out that the use of polyethylene oxide as the chemical additive in barrier slurries led to the suppression of removal rates on low-k film, BD1 (Black Diamond® 1). This is also useful for some advanced node applications which demand the suppression of low-k or ultra low-k film removal rates.

The results of the effects on defect counts of polyethylene oxide with different molecular weight distributions but the same concentration on copper and TEOS substrates were listed in Table 6.

TABLE 6

Effects of PEO with different MW on Defect Count on Cu and TEOS

| Formulations (2 wt % silica) | Defect Count on Cu (0.125 micron) | Defect % Change (0.125 micron) | Defect Count on TEOS (0.13 micron) |
|---|---|---|---|
| Control barrier slurry without PEO | 213 | — | 50 |
| Barrier slurry with PEO MW 600,000 | 101 | −52.6% | 22 |
| Barrier slurry with PEO MW 1,000,000 | 101 | −52.6% | 18 |

As the results shown in Table 6, when polyethylene oxide additives either with molecular weight at 600,000 or 1,000,000, were used in barrier CMP polishing compositions, defect counts on copper and TEOS substrates were both reduced.

More specifically, for both molecular weights of polyethylene oxide being used as the chemical additive in barrier CMP polishing compositions, the defect count on copper substrate was reduced by about 52.6%. The defect counts on TEOS substrate were reduced from 50 to 22 for polyethylene oxide with 600,000 molecular weight, and to 18 for polyethylene oxide with 1,000,000 molecular weight, respectively.

TABLE 7

Effects of PEO with different MW on the removal rates

| Formulations (2 wt % silica) | TaN RR (A/min.) | Cu RR (A/min.) | TEOS RR (A/min.) |
|---|---|---|---|
| Control barrier slurry no PEO | 477 | 444 | 450 |
| Barrier slurry with 1X PEO MW 100,000 | 474 | 364 | 427 |
| Barrier slurry with 10X PEO MW 100,000 | 483 | 375 | 380 |
| Barrier slurry with 1X PEO MW 300,000 | 486 | 408 | 403 |
| Barrier slurry with 10X PEO MW 300,000 | 567 | 403 | 385 |
| Barrier slurry with 5X PEO MW 400,000 | 588 | 431 | 408 |
| Barrier slurry with 1X PEO MW 1,000,000 | 524 | 447 | 391 |
| Barrier slurry with 10X PEO MW 1,000,000 | 625 | 374 | 424 |

In a different data set, other molecular weights and concentrations of PEO were also tested for the TaN film removal rates. The results were summarized in Table 7. All the barrier CMP polishing compositions contained the same type and concentration of colloidal silica as abrasives, and all abrasive were at 2 wt % concentration for the formulations with or without PEO.

As the results showed in Table 7, when lower molecular weight 100,000 of PEO was used as the chemical additive, at 1× concentration, the TaN removal rate was similar to the removal rate from the reference. Thus, the lower molecular weight of PEO less or equal 100,000 did not boost TaN film removal rates.

When 1× and 10× concentrated PEO with molecular weight 300,000 were used as the chemical additive, increases in the TaN removal rates were clearly observed. The rates increased from 477 A/min. to 486 and 567 A/min., representing about 2% and about 19% TaN removal rate boosting, respectively.

The reduced removal rates (compared to the reference) of copper film and TEOS from the polishing compositions having polyethylene oxide polymer with different molecular weights could expand the desirable selectivity among various films.

The polishing removal rate data, as shown in the aforementioned Tables indicated that the tantalum nitride removal rate was boosted due to the use of polyethylene oxide polymer as the chemical additive. This result made it possible to use lower abrasive concentrations in the invented barrier CMP polishing compositions to achieve excellent defect reduction performances but still provide the similar removal rates while polishing barrier films, and to provide the desirable selectivity among various films.

Using polyethylene oxide polymer with different molecular weight distributions as key chemical additives in the invented barrier CMP polishing compositions increased removal rates while polishing barrier film, such as TaN. Using polyethylene oxide polymer with different molecular weight distributions as key chemical additives in the invented barrier CMP polishing compositions reduced defect counts on wafer surfaces. The lower abrasive concentration was adopted in the invented barrier polishing compositions due to the boosted barrier film removal rates by using polyethylene oxide polymer as the chemical additive. Thus, further reduction on defect counts was achieved due to the adoption of using lower abrasive concentration in barrier polishing compositions and still provided the desirable removal rates on removing barrier films; and provided the desirable selectivity while polishing multi types of films in barrier CMP process.

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

The invention claimed is:

1. A polishing method for chemical mechanical planarization of a semiconductor substrate having at least one surface having conductive metal lines, vias or trenches, a metal-containing barrier layer and a dielectric layer, comprising the steps of:
   a) contacting the at least one surface with a polishing pad;
   b) delivering a barrier polishing composition to the at least one surface, the polishing composition consisting essentially of:
      abrasive;
      organic polymer containing ethylene oxide repeating units having the general molecular structure of

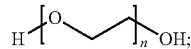

wherein n refers to the total numbers of the repeating unit giving molecular weights ranging from 100,000 to 8,000,000 and concentration ranging from about 5 ppm to about 5,000 ppm;
      oxidizing agent;
      corrosion inhibitor;
      chelator selected from the group consisting of benzosulfonic acid, 4-tolyl sulfonic acid, 2,4-diamino-benzosulfonic acid, itaconic acid, gluconic acid, mandelic acid, and combinations thereof; and
      water;
   and
   c) polishing at least the metal-containing barrier layer on the substrate with the barrier polishing composition.

2. The method of claim 1 wherein the organic polymer containing ethylene oxide repeating units having molecular weights ranging from 400,000 to 1,500,000; and concentration ranging from about 25 ppm to about 2,000 ppm.

3. The method of claim 1 wherein the abrasive is selected from the group consisting of colloidal silica, alumina, ceria, germania, silica, titania, zirconia, alumina dopes colloidal silica in lattices, organic polymer particles, composite particles comprising organic and inorganic particles, surface modified organic or inorganic particles, and combinations thereof; and is present in an amount ranging from about 0.1% to about 15 wt %.

4. The method of claim 1 wherein the oxidizing agent is selected from the group consisting of hydrogen peroxide, periodic acid, potassium iodate, potassium permanganate, ammonium persulfate, ammonium molybdate, ferric nitrate, nitric acid, potassium nitrate, ammonia, amine compounds, and combinations thereof; and is present in an amount ranging from about 0.01 wt % to about 10 wt %.

5. The method of claim 1 wherein the corrosion inhibitor is selected from the group consisting of benzotriazole or benzotriazole derivative, 3-amino-1, 2, 4-triazole, 3, 5-di-amine-1, 2, 4-triazole, and combinations thereof; and is present in an amount ranging from about 0.001 wt % to about 1.0 wt %.

6. The method of claim 1 wherein the chelator is present in an amount ranging from about 0.01 wt % to about 3.0 wt %.

7. The method of claim 1 wherein the conductive metal is copper; the metal-containing barrier layer is a tantalum-containing barrier layer; the dielectric layer is selected from the group consisting of TEOS, and low-k material.

8. A polishing method for chemical mechanical planarization of a semiconductor substrate having at least one surface having conductive metal lines, vias or trenches, a metal-containing barrier layer and a dielectric layer, comprising the steps of:
   a) contacting the at least one surface with a polishing pad;
   b) delivering a barrier polishing composition to the at least one surface, the polishing composition consisting essentially of:
      abrasive;
      organic polymer containing ethylene oxide repeating units having the general molecular structure of

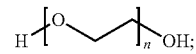

wherein n refers to the total numbers of the repeating unit giving molecular weights ranging from 100,000 to 8,000,000 and concentration ranging from about 5 ppm to about 5,000 ppm;
      oxidizing agent;
      corrosion inhibitor;
      chelator selected from the group consisting of benzosulfonic acid, 4-tolyl sulfonic acid, 2,4-diaminobenzosulfonic acid, itaconic acid, gluconic acid, mandelic acid, and combinations thereof;
      a pH adjustor, present in an amount ranging from about 0.0001 wt % to 2 wt %, selected from the group consisting of (a) nitric acid, sulfuric acid, tartaric acid, succinic acid, citric acid, malic acid, malonic acid, fatty acid, polycarboxylic acid and combinations thereof to lower pH of the polishing composition; and (b) potassium hydroxide, sodium hydroxide, ammonia, tetraethylammonium hydroxide, ethylenediamine, piperazine, polyethyleneimine, modified polyethyleneimine, and combinations thereof to raise pH of the polishing composition; and,
      water;
      wherein the polishing composition has a pH from about 2 to about 12; and,
   c) polishing at least the metal-containing barrier layer on the substrate with the barrier polishing composition.

9. A polishing method for chemical mechanical planarization of a semiconductor substrate having at least one surface having conductive metal lines, vias or trenches, a metal-containing barrier layer and a dielectric layer, comprising the steps of:

a) contacting the at least one surface with a polishing pad;

b) delivering a barrier polishing composition to the at least one surface, the polishing composition consisting essentially of:

abrasive;

organic polymer containing ethylene oxide repeating units having the general molecular structure of

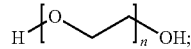

wherein n refers to the total numbers of the repeating unit giving molecular weights ranging from 100,000 to 8,000,000 and concentration ranging from about 5 ppm to about 5,000 ppm;

oxidizing agent;

corrosion inhibitor;

chelator selected from the group consisting of benzosulfonic acid, 4-tolyl sulfonic acid, 2,4-diaminobenzosulfonic acid, itaconic acid, gluconic acid, mandelic acid, and combinations thereof;

a surfactant selected from the group consisting of nonionic, anionic, cationic or amphoteric surfactants, and combinations thereof; and is present in an amount ranging from about 0.0001 wt % to about 1.0 wt %; and, water;

and c) polishing at least the metal-containing barrier layer on the substrate with the barrier polishing composition.

10. The method of claim 9 wherein the abrasive is colloidal silica and is present in an amount ranging from about 1 wt % to about 3 wt %; the oxidizing agent is hydrogen peroxide and is present in an amount ranging from about 0.5 wt % to about 2 wt %; the corrosion inhibitor is benzotriazole or benzotriazole derivative and is present in an amount ranging from about 0.01 wt % to about 0.1 wt %; the chelator is benzosulfonic acid and is present in an amount ranging from about 0.4 wt % to about 1.5 wt %; the organic polymer contains ethylene oxide repeating units having molecular weights ranging from 300,000 to 1,000,000, and is present in an amount ranging from about 50 ppm to about 1,000 ppm; the surfactant is tricosaethylene glycol dodecyl ether and is present in an amount ranging from about 0.010% to about 0.1%; the metal-containing barrier layer is a tantalum-containing barrier layer; the dielectric layer is selected from the group consisting of TEOS, and low-k material; and the composition has a pH from about 9 to about 11.5.

11. The method of claim 10 wherein the polishing composition providing a TaN to TEOS selectivity about 1.5 to about 0.84.

* * * * *